United States Patent
Lee et al.

(10) Patent No.: US 6,858,906 B2
(45) Date of Patent: Feb. 22, 2005

(54) FLOATING TRAP NON-VOLATILE SEMICONDUCTOR MEMORY DEVICES INCLUDING HIGH DIELECTRIC CONSTANT BLOCKING INSULATING LAYERS

(75) Inventors: Chang-Hyun Lee, Kyunggi-do (KR); Jung-Dal Choi, Kyunggi-do (KR); Byoung-Woo Ye, Kyunggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/184,328

(22) Filed: Jun. 27, 2002

(65) Prior Publication Data

US 2003/0047755 A1 Mar. 13, 2003

(30) Foreign Application Priority Data

Jun. 28, 2001 (KR) ........................................ 2001-37421
Jan. 31, 2002 (KR) ........................................ 2002-5622

(51) Int. Cl.[7] .............................................. H01L 29/76
(52) U.S. Cl. ........................ 257/406; 257/316; 257/317; 257/407
(58) Field of Search ................................ 257/406, 405, 257/407, 408, 315, 316, 317, 200

(56) References Cited

U.S. PATENT DOCUMENTS

| | | | |
|---|---|---|---|
| 5,270,298 A | * 12/1993 | Ramesh | 505/238 |
| 5,923,056 A | 7/1999 | Lee et al. | 257/192 |
| 6,225,646 B1 | 5/2001 | Gardner et al. | 257/59 |
| 6,236,076 B1 | 5/2001 | Arita et al. | 257/295 |
| 6,307,775 B1 | * 10/2001 | Forbes et al. | 365/185.01 |
| 6,417,537 B1 | * 7/2002 | Yang et al. | 257/310 |
| 6,458,677 B1 | * 10/2002 | Hopper et al. | 438/591 |
| 6,465,828 B2 | * 10/2002 | Agarwal | 257/296 |
| 2002/0020871 A1 | * 2/2002 | Forbes | 257/315 |
| 2003/0155605 A1 | * 8/2003 | Jong et al. | 257/314 |
| 2003/0235083 A1 | * 12/2003 | Swift et al. | 365/185.29 |

FOREIGN PATENT DOCUMENTS

| | | |
|---|---|---|
| JP | 08-017945 | 1/1996 |
| JP | 11-008325 | 1/1999 |
| JP | 2001077319 A | 3/2001 |
| WO | WO 00/75997 A1 | 12/2000 |

* cited by examiner

*Primary Examiner*—Long Pham
*Assistant Examiner*—Nathan W. Ha
(74) *Attorney, Agent, or Firm*—Myers Bigel Sibley & Sajovec, P.A.

(57) ABSTRACT

Floating trap non-volatile memory devices and methods are provided. The memory devices include a semiconductor substrate and an adjacent gate electrode. Between the substrate and the gate electrode may be a tunneling insulating layer having a first dielectric constant, a blocking insulating layer having a second dielectric constant that is greater than the first dielectric constant, and a charge storage layer.

30 Claims, 9 Drawing Sheets

FLOATING TRAP NON-VOLATILE SEMICONDUCTOR MEMORY DEVICES INCLUDING HIGH DIELECTRIC CONSTANT BLOCKING INSULATING LAYERS

RELATED APPLICATION

This application relies for priority upon Korean Patent Application No. 2002-05622, filed on Jan. 31, 2002 and No. 2001-37421, filed on Jun. 28, 2001, the contents of which are herein incorporated by reference in their entirety.

FIELD OF THE INVENTION

The present invention relates to a non-volatile memory device and, more particularly, to a floating trap non-volatile memory device.

BACKGROUND OF THE INVENTION

Two types of non-volatile memory devices are floating gate type memory devices and floating trap type memory devices. A floating gate type memory device may include a control gate and a conductive floating gate that is isolated, by an insulating layer, from a substrate channel. Floating gate type memory devices may be programmed by storing charges as free carriers on the conductive floating gate.

Floating trap type memory devices may include a non-conductive charge storage layer between a gate electrode and a substrate. Floating trap type memory devices may be programmed by storing charges in traps in the non-conductive charge storage layer.

Floating gate type memory devices generally have a thicker tunneling insulating layer than floating trap type memory devices to provide comparable reliability for storing charges. A thicker tunneling insulating layer may result in an increased operating voltage for the memory device and an increased complexity of associated peripheral circuitry. Consequently, it may be more difficult to provide high integration density and low power consumption for floating gate type memory devices than for floating trap type memory devices.

A SONOS (silicon-oxide-nitride-oxide-semiconductor) structure of a conventional floating trap type unit memory device is shown in FIG. 1. The memory device includes a tunneling insulating layer 20, a charge storage layer 22, a blocking insulating layer 24, and a gate electrode 27 that are sequentially stacked on an active region of a P-type semiconductor substrate 10. An N⁺ type impurity diffusion layer 28 is formed at an active region on opposite sides of the gate electrode 27. The tunneling insulating layer 20 may include a thermal oxide material and the charge storage layer 22 may include silicon nitride material.

An energy band diagram of a floating trap type unit memory device is shown in FIG. 2, taken along a line I-I' of FIG. 1. Intrinsic energy band gaps are shown for the materials corresponding to the semiconductor substrate 10, the tunneling insulating layer 20, the charge storage layer 22, the blocking insulating layer 24, and the gate electrode 27. Differences between the energy band gaps may result in potential barriers at the interfaces between the materials.

For example, the charge storage layer 22 can include silicon nitride which has an energy band gap of about 5 eV. The corresponding potential barriers between the tunneling insulating layer 20 and the charge storage layer 22 may be about 1 eV and 2 eV, respectively, for the conduction band and the valence band.

A silicon nitride layer is known to have three trap levels. A trap center of the silicon nitride layer includes a silicon atom that combines with three nitrogen atoms and has one dangling bond. When no electron combines with the dangling bond (i.e., a hole combines therewith), the state may be called a first trap level $E_1$. When one electron combines with the dangling bond, the state may be called a second trap level $E_2$, which is higher than the first trap level $E_1$. When two electrons combine with the dangling bond, the state may be called a third trap level $E_3$, which is higher than the second trap level $E_2$.

A floating trap type non-volatile memory device uses trap levels, such as those found in a silicon nitride layer, for memory operations. When a positive voltage is applied on the gate electrode 27, electrons are tunneled via the tunneling insulating layer 20 to become trapped in the charge storage layer 22. As the electrons are accumulated in the charge storage layer 22, a threshold voltage of the memory device is increased, and the memory device becomes programmed.

In contrast, when a negative voltage is applied to the gate electrode 27 as shown in FIG. 3, trapped electrons are discharged to the semiconductor substrate 10 via the tunneling insulating layer 20. Concurrently, holes become trapped in the first trap level $E_1$ from the semiconductor substrate 10 by the tunneling insulating layer 20. Consequently, the threshold voltage of the unit memory device is decreased, and the memory device becomes erased.

For the memory device to be programmed, the quantity of charges from the channel should be relatively greater than the quantity of charges from the gate electrode. For example, when a positive voltage is applied to the gate electrode, if the quantity of holes provided from the gate electrode to the floating trap is equal to the quantity of electrons provided from the channel to the floating trap, negative charges are offset by positive charges and vice versa. Accordingly, the threshold voltage is not changed and programming may be precluded.

When the thickness of the silicon oxide layer, serving as a tunneling oxide layer, is 20 Å or less, current flow from direct tunneling may exceed current flow from F-N tunneling and an erase operation may occur. When a blocking oxide layer has a thickness of about 50 Å, charge may be primarily moved by F-N tunneling and the quantity of charges from the channel may be greater than the quantity of charges from the gate electrode. In contrast, when the thickness of the tunneling insulating layer is 20 Å or less and the blocking insulating layer is thicker than the tunneling insulating layer, charges may be primarily provided from the channel in erase and program operations, and the threshold voltage may be more easily controlled.

The thickness of the silicon oxide layer may affect the data retention time of the memory device. For example, when the thickness of the silicon oxide layer is 20 Å or less, charges stored in the floating trap may leak more easily and the data retention time of the memory device may be shortened. When the thickness of the silicon oxide layer is 20 Å or higher, the data retention time may be increased but the primary flow of charges to the floating trap may be by F-N tunneling. F-N tunneling may be more easily carried out as the effective mass of charge carriers becomes smaller and the electric field on the charge carrier path becomes stronger.

Conventional operations for programming and erasing a floating trap type memory device will now be described. During an early phase of a programming operation, when the tunneling insulating layer and the blocking insulating layer are oxide materials and a voltage is applied to the gate electrode, the generated electric field can be described by Equation 1 below.

$$Eot = Eob = \frac{Vg - \Phi ms - 2\Phi b}{Xot + \frac{\varepsilon(ot)}{\varepsilon(SIN)} + Xob} \qquad \text{Equation 1}$$

The symbols "ot", "ob", and "SIN" represent the tunneling insulating layer, the blocking insulating layer, and the silicon nitride layer, respectively. The symbol "E" represents the electric field, "Vg" represents the voltage of a gate electrode, "Φms" represents a difference of a work function between the substrate and the gate electrode, "Φb" represents a substrate surface potential, "X" represents a thickness of the oxide layer, and "ε" represents a dielectric constant.

During the early phase of the programming operation, when a positive voltage is applied to the gate electrode, a hole is moved from the gate electrode to the floating trap and an electron is moved from the channel to the floating trap. When more electrons are provided to the gate electrode than holes, the threshold voltage is increased. As electrons become trapped in the floating trap of the charge storage layer and accumulate therein, the electric field applied to the blocking insulating layer may become stronger than the electric field applied to the tunneling insulating layer. Once stronger, trapped electrons become increasingly discharged via the blocking insulating layer, or holes become increasing injected from the gate electrode, so that growth of the threshold voltage becomes limited.

During an erasing operation, when a relatively lower voltage is applied to the gate electrode, electrons move by F-N tunneling from the gate electrode to the floating trap and holes move from the channel to the floating trap. Because the effective mass of electrons is lower than that of holes, electrons more easily flow from the gate electrode than holes from the channel. In an early phase of the erasing operation, when the floating trap of the silicon nitride layer (i.e., the charge storage layer) is uniformly filled with electrons, the quantity of charge, Q, may be negative. With a negative Q, the blocking insulating layer and the tunneling insulating layers can be described by Equations 2 and 3 below.

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob} \qquad \text{Equation 2}$$

$$Eob = Eot + \frac{Q}{\varepsilon(ot)} \qquad \text{Equation 3}$$

The symbols "ot", "ob", and "SIN" represent the tunneling insulating layer, the blocking insulating layer, and the silicon nitride layer, respectively. The symbol "E" represents an electric field, "Vg" represents a voltage of the gate electrode, "Φms" represents a difference of a work function between the substrate and the gate electrode, "Φb" represents a substrate surface potential, "X" represents a thickness of an oxide layer, and "Q" represents the quantity of charges at the silicon nitride layer.

When the thickness of the tunneling insulating layer is 20 Å or more, charges are moved at the tunneling insulating layer and the blocking insulating layer by F-N tunneling. During an erasing operation, the quantity of electrons provided from the gate electrode may exceed the quantity of holes provided from the channel and the floating trap can accumulate a negative charge, which may make it difficult to sufficiently decrease the threshold voltage to erase the memory.

SUMMARY OF THE INVENTION

Floating trap type non-volatile memory devices according to some embodiments of the present invention include a semiconductor substrate and an adjacent gate electrode. Between the substrate and the gate electrode may be a tunneling insulating layer having a first dielectric constant, a blocking insulating layer having a second dielectric constant that is greater than the first dielectric constant, and a charge storage layer.

Floating trap type non-volatile memory devices according to some other embodiments of the present invention include a semiconductor substrate with a plurality of parallel active regions. A plurality of parallel memory gate electrodes intersect and pass over the active regions. Between the intersections of the electrode and the active regions may be a tunneling insulating layer having a first dielectric constant, a blocking insulating layer having a second dielectric constant that is greater than the first dielectric constant, and a charge storage layer.

DETAILED DESCRIPTION OF THE INVENTION

Figure 1:
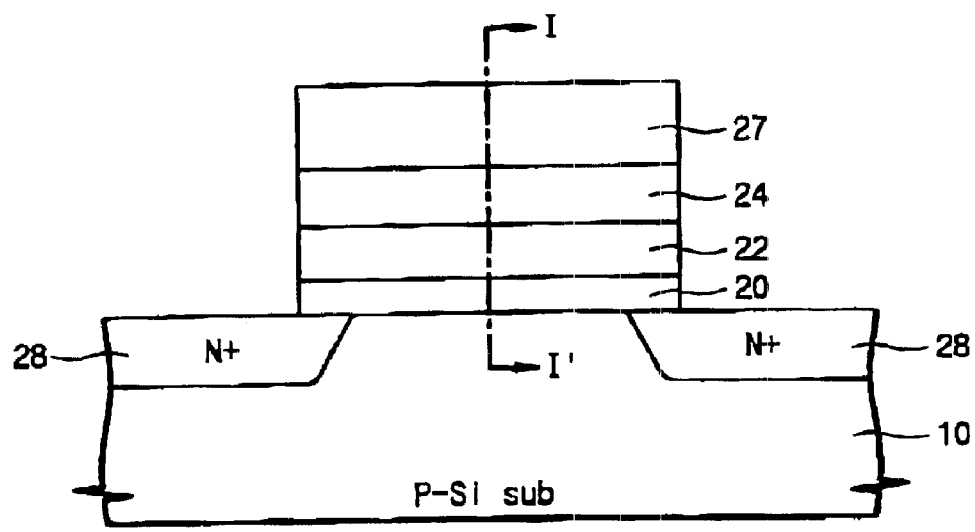
FIG. 1 is a cross-sectional view of a SONOS (silicon oxide nitride oxide semiconductor) structure of a conventional floating trap type unit memory device.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 4:
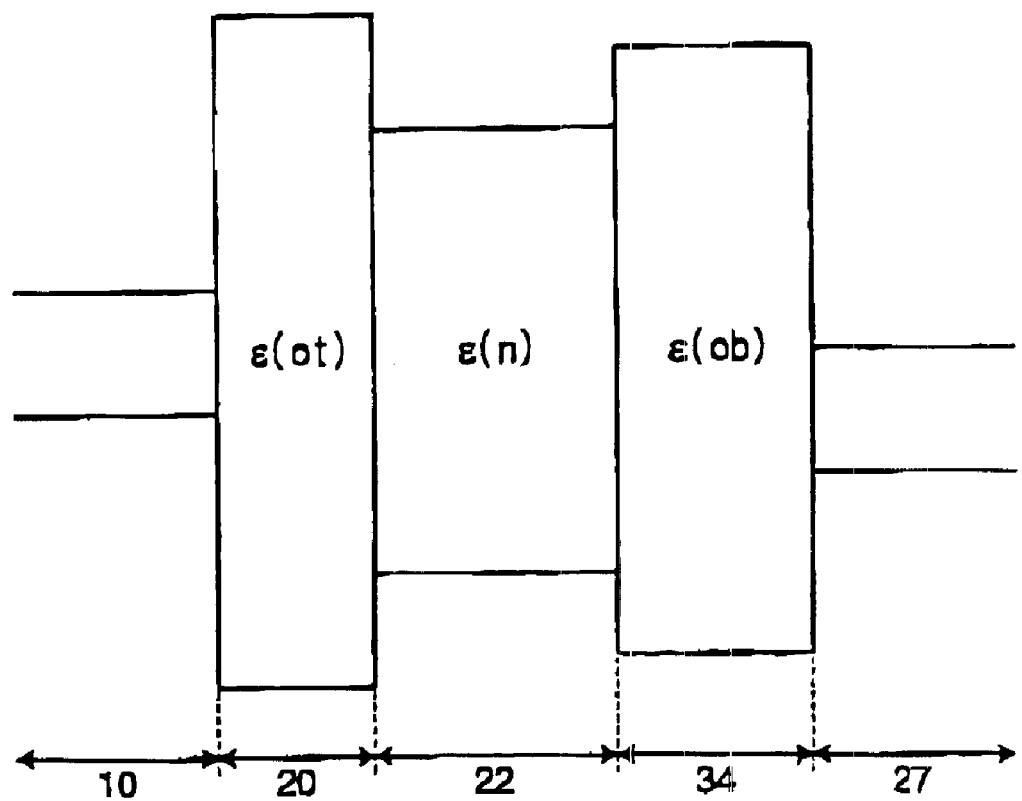
FIG. 4 is an energy band diagram of a floating trap type memory device according to some embodiments of the present invention.

An energy band diagram of a floating trap type memory device according to some embodiments of the present invention is shown in FIG. 4. The floating trap type memory device, as represented in the memory band diagram, may include a substrate 10, a tunneling insulating layer 20, a charge storage layer 22, a dielectric layer 34, and a gate electrode 27. The dielectric layer 34 may serve as a blocking insulating layer. Early in a programming operation of the memory device, electric field intensities of the tunneling insulating layer 20 and the blocking insulating layer 34 may be described by Equations 4 and 5 below.

Equation 4:

$$Eot = \frac{Vg - \Phi ms - 2\Phi b}{Xot + Xn\frac{\varepsilon(ot)}{\varepsilon(n)} + Xob\frac{\varepsilon(ot)}{\varepsilon(ob)}}$$

Equation 5:

$$Eob = Eot + \frac{\varepsilon(ot)}{\varepsilon(ob)}$$

The symbols "ot", "ob", and "n" represent the tunneling insulating layer 20, the blocking insulating layer 34, and the charge storage layer 22, respectively. The symbol "E" represents an electric field, "Vg" represents a voltage of the gate electrode 27, "Φms" represents a difference of a work function between the substrate 10 and the gate electrode 27, "Φb" represents a substrate surface potential, "X" represents a thickness of an oxide layer, and "ε" represents a dielectric constant.

According to some embodiments of the present invention, a dielectric constant of the dielectric layer 34 may be higher than a dielectric constant of the tunneling insulating layer 20. A higher dielectric constant for the dielectric layer 34 may provide a higher electric field intensity for the tunneling insulating layer 20 than for the dielectric layer 34 (See Equation 5). When programming such a memory device, electrons may be more easily injected via the tunneling insulating layer 20 and a higher quantity of electrons may flow from the channel than from the gate electrode 27. A result may be faster programming of the memory device.

Referring to Equations 4 and 1, during programming of a floating trap type memory device according to embodiments of the present invention an electric field in the tunneling oxide layer 20 (hereinafter referred to as "EF$_P$") may be stronger than an electric field in the tunneling oxide layer 20 (hereinafter referred to as "EF$_C$"). When "EF$_C$" is positive, a positive result may be obtained when "EF$_P$" is subtracted from "EF$_C$", as shown by Equation 6.

$$\Delta Eot = \frac{(Vg - \Phi ms - 2\Phi b)\left(1 - \frac{\varepsilon(ot)}{\varepsilon(ob)}\right)Xob}{\left(Xot + Xn\frac{\varepsilon(ot)}{\varepsilon(n)} + Xob\right)\left(Xot + Xn\frac{\varepsilon(ot)}{\varepsilon(n)} + X\frac{\varepsilon(ot)}{\varepsilon(ob)}\right)} \quad [\text{Equation 6}]$$

Figure 2:
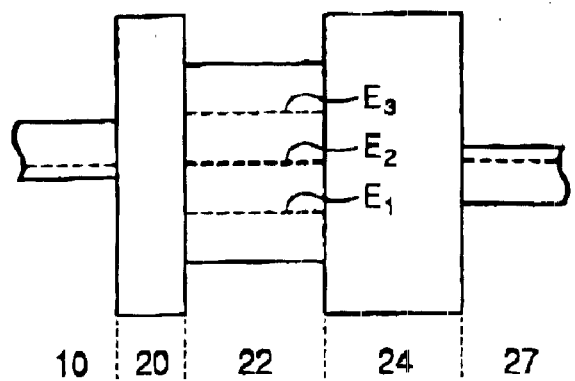
FIG. 2 is an energy band diagram of a conventional floating trap type unit memory device taken along a line of I-I' in FIG. 1.
Figure 3:
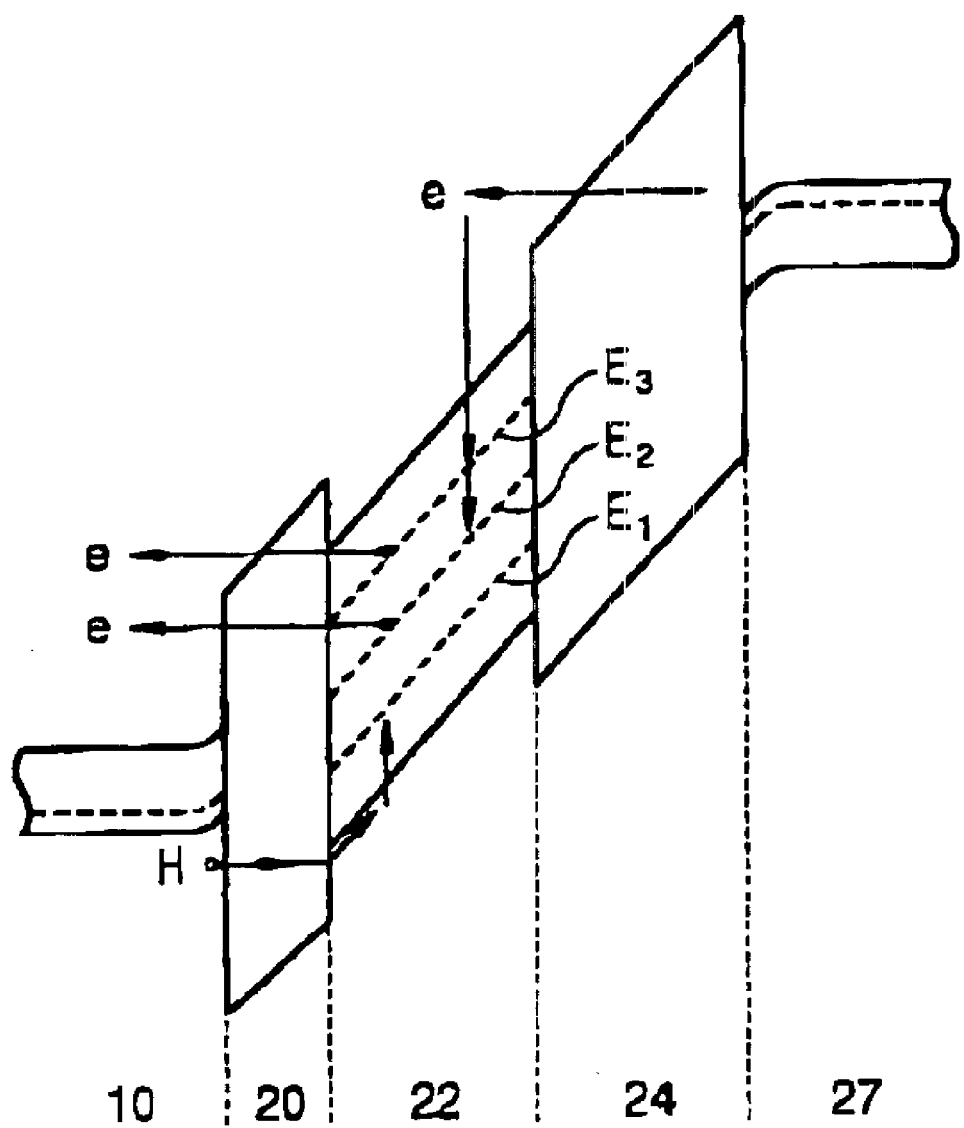
FIG. 3 is an energy band diagram of an energy band and carrier flow when a voltage is applied to a gate electrode of a conventional memory device, such as that shown in FIG. 2.

The symbol "ε(ob)" represents a high dielectric constant of the dielectric layer 34. The high dielectric constant may provide a faster program operation of the memory relative to an equivalent voltage applied to a conventional memory device such as shown in FIG. 2.

The relationship of the electric fields strengths of the tunneling insulating layer 20 to the dielectric layer 34 during an erase operation may be described by Equations 7 and 8 below.

Equation 7:

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob\frac{\varepsilon(ot)}{\varepsilon(ob)}}$$

Equation 8:

$$Eob = \left(Eot + \frac{Q}{\varepsilon(ot)}\right)\frac{\varepsilon(ot)}{\varepsilon(ob)}$$

The symbol "Q" represents a quantity of charges in the charge storage layer 22 and has a negative value, "ε(ob)" represents a dielectric constant of a dielectric layer 34, and "ε(ot)" represents a dielectric constant of the tunneling insulating layer 20.

When "ε(ob)" is sufficiently larger than "ε(ot)", the electric field of the tunneling insulating layer 20 may become stronger than the electric field of the dielectric layer 34. The change in the charge quantity caused by a charge carrier movement via the tunneling insulating layer 20 (i.e., inflow of channel holes and outflow of electrons from the charge storage layer 22) may be larger than the change in the charge quantity caused by a charge carrier movement via the dielectric layer 34 (i.e., inflow of electrons from the gate electrode 27). In such a case, the threshold voltage may be more easily decreased by the inflow of channel holes at the charge storage layer 22 and an erase operation may be more easily performed.

During an erase operation, the electric field applied to the tunneling insulating layer 20 of the memory device of FIG. 4 may be stronger than the electric field applied to a tunneling insulating layer 20 of the memory device of FIG. 2, as may be shown for example by Equation 6. In this manner, the speed of the erase operation may be increased.

Figure 5:
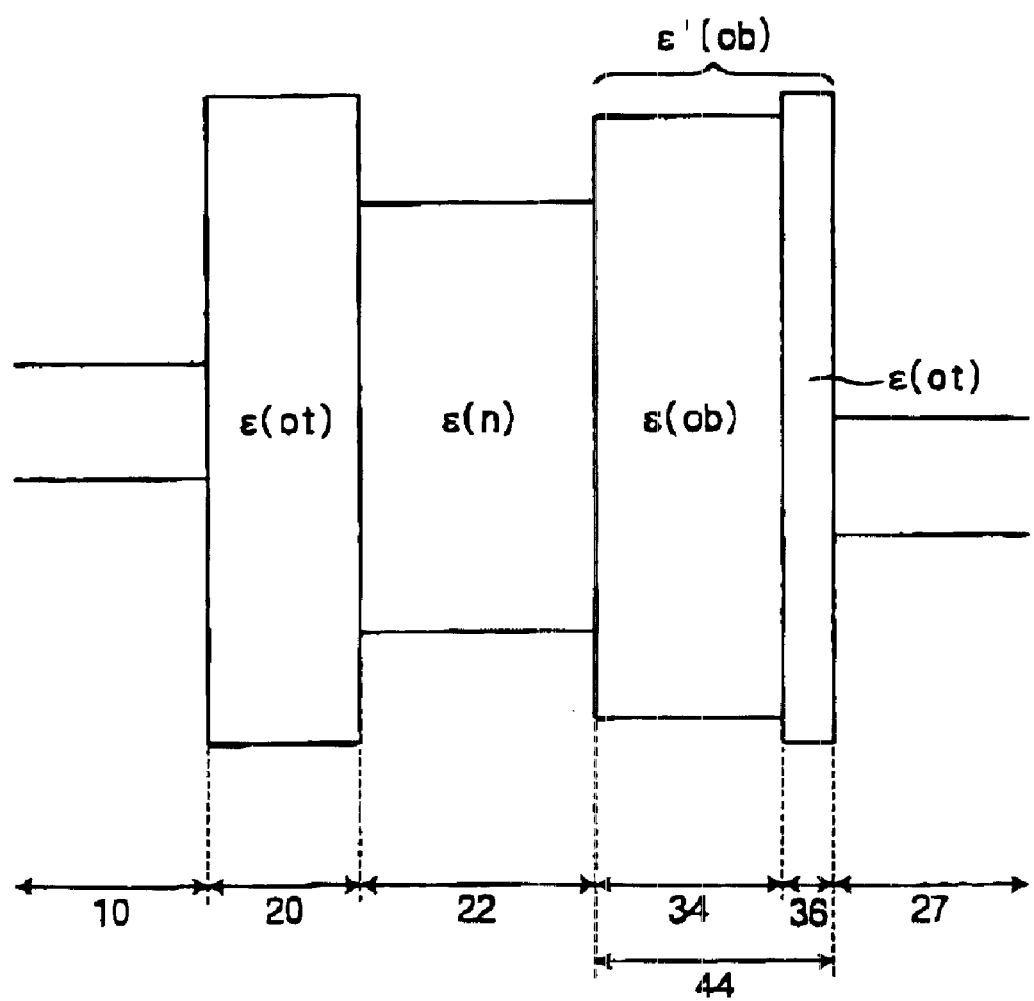
FIG. 5 is an energy band diagram of a floating trap type memory device according to additional embodiments of the present invention.

Referring to FIG. 5, a memory device according to additional embodiments of the present invention is shown. The memory device includes a semiconductor substrate 10, a tunneling insulating layer 20, a charge storage layer 22, a blocking insulating layer 44, and a gate electrode 27. The blocking insulating layer 44 may include a dielectric layer 34 and a silicon oxide layer 36 between the charge storage layer 22 and the gate electrode 27. More particularly, the silicon oxide layer 36 can be between the dielectric layer 34 and the gate electrode 27.

Figure 6:
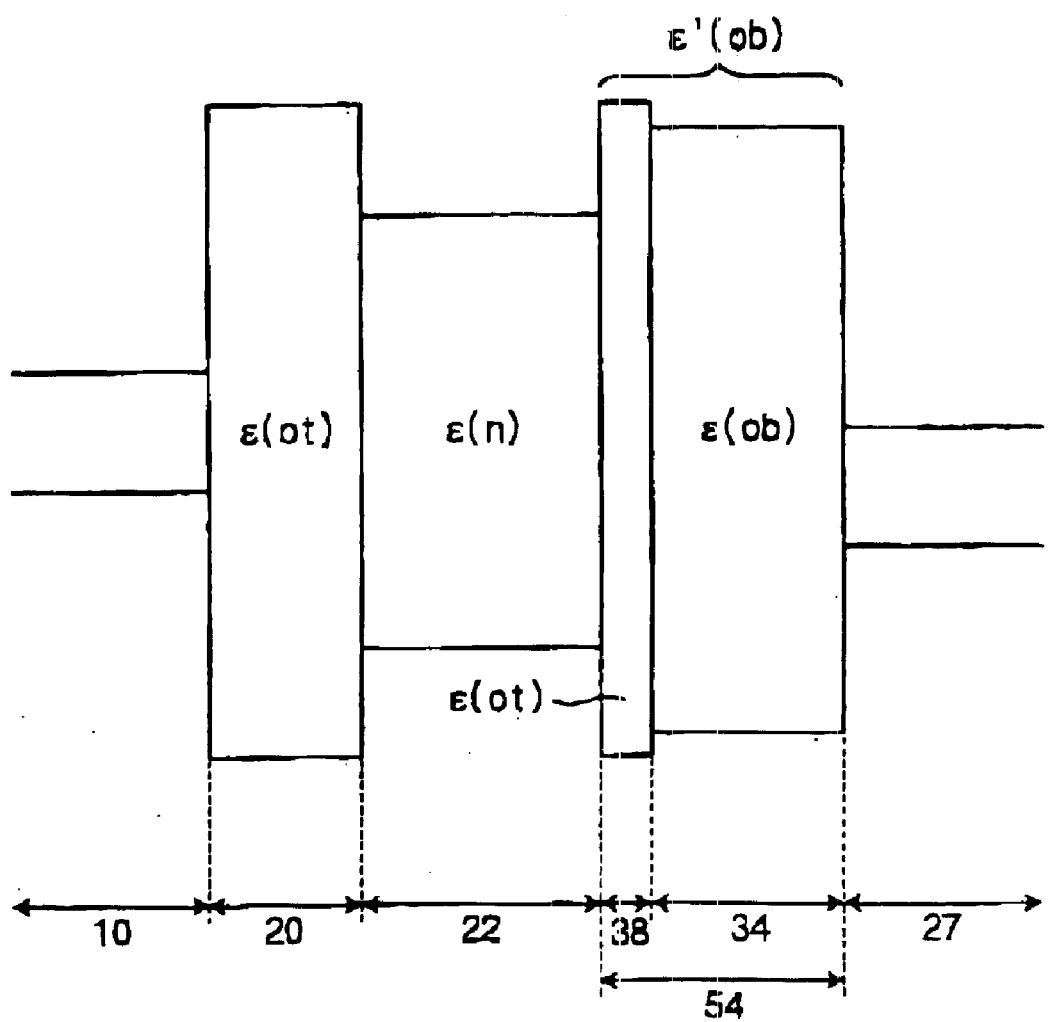
FIG. 6 is an energy band diagram of a floating trap type memory device according to additional embodiments of the present invention.

Referring to FIG. 6, a memory device according to additional embodiments of the present invention is shown.

The memory device includes a semiconductor substrate 10, a tunneling insulating layer 20, a charge storage layer 22, a blocking insulating layer 54, and a gate electrode 27. The blocking insulating layer 54 includes a dielectric layer 34, having a high dielectric constant, and a silicon oxide layer 38 between the charge storage layer 22 and the gate electrode 27. More particularly, the dielectric layer 34 can be between the silicon oxide layer 38 and the gate electrode 27.

Figure 7:
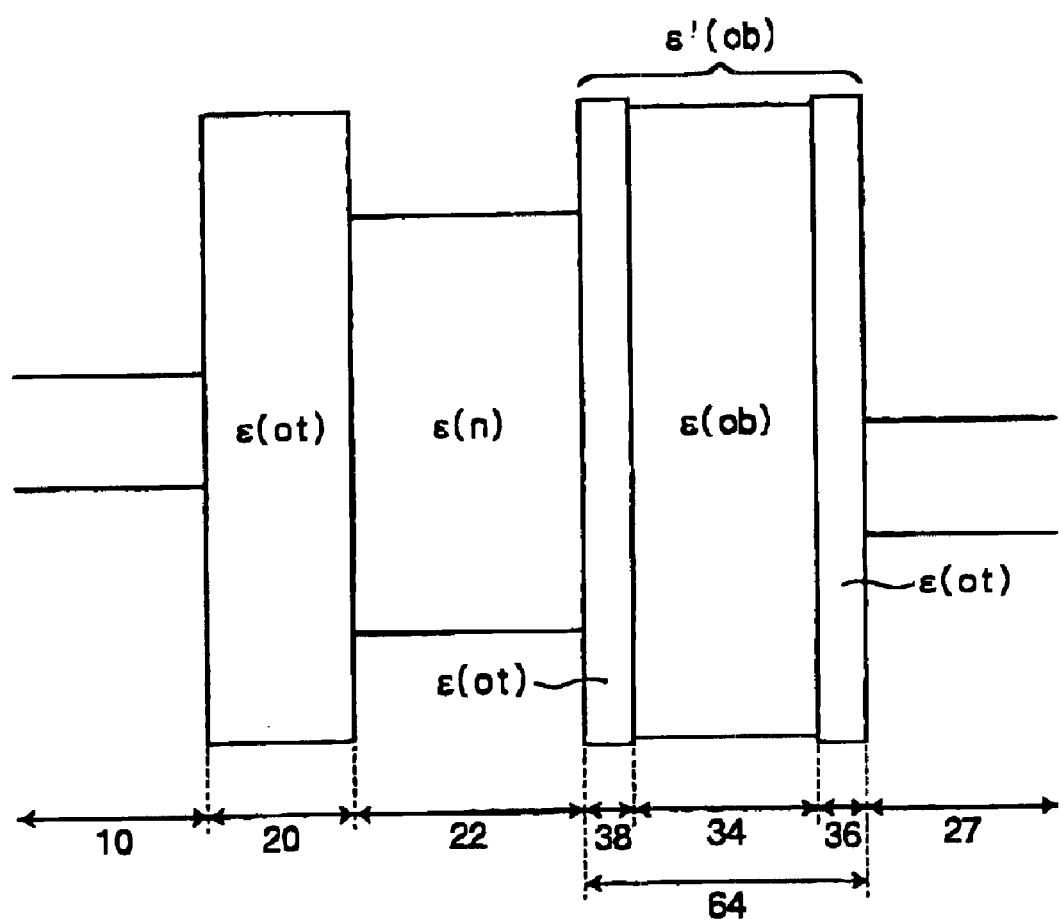
FIG. 7 is an energy band diagram of a floating trap type memory device according to additional embodiments of the present invention.

Referring to FIG. 7, a memory device according to additional embodiments of the present invention is shown. The memory device includes a semiconductor substrate 10, a tunneling insulating layer 20, a charge storage layer 22, a blocking insulating layer 64, and a gate electrode 27 disposed sequentially. The blocking insulating layer 64 includes a first silicon oxide layer 36 between a high dielectric layer 34 and a gate electrode 27 and a second silicon oxide layer 38 between the high dielectric layer 34 and the charge storage layer 22.

Equations 4 through 7 may describe the respective electric fields of the embodiments of the memory devices in FIGS. 4–7. For example, in the embodiments of FIGS. 5–7, a constant "ε(ob)" of the blocking insulating layers may be related to the constants of the dielectric layers and the oxide layer of the blocking insulating layers. When a blocking insulating layer of these embodiments has the same thickness as the blocking insulating layer of the memory device of FIG. 2, the electric field may become dependent upon the dielectric constant and the thickness of the dielectric layer. The oxide layer of the blocking insulating layer may increase a breakdown voltage of the blocking insulating layer. The oxide layer may also enhance an adhesiveness between the high dielectric layer and the gate electrode or between the high dielectric layer and the charge storage layer.

According to additional embodiments of the present invention, the dielectric layer 34 may comprise metallic oxide or metallic oxynitride of a group III element or group VB element in the Mendeleef Periodic Table. According to other embodiments, the dielectric layer 34 may comprise doped metal oxide or doped metal oxynitride in which metal oxide is doped with a group IV element in the Mendeleef Periodic Table. The group IV element may reduce leakage current from the memory device. The group IV element may be doped with a metal oxide of about 0.1–30 weight percent. The dielectric layer 34 may also comprise one of more of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and combinations thereof.

The material $Al_2O_3$ has a dielectric constant of 10 and an energy band gap of 8.3 eV and the material $ZrO_2$ has a dielectric constant of 25 and an energy band gap of 8.3 eV. The dielectric layer 34 may also comprise one or more of AlO, $Al_2O_3$, $Ta_2O_5$, $TiO_2$, $PZT[Pb(Zr, Ti)O_3]$, $PbTiO_3$, $PbZrO_3$, $PZT[(Pb, La)(Zr, Ti)O_3]$, PbO, $SrTiO_3$, $BaTiO_3$, $V_2O_5$, $BST[(Ba, Sr)TiO_3]$, $SBT(SrBi_2Ta_2O_9)$, $Bi_4Ti_3O_{12}$, and combinations thereof.

The charge storage layer 22 may comprise one or more of $Si_3N_4$, silicon oxynitride, silicon-rich oxide, and other ferroelectric materials.

Figure 8:
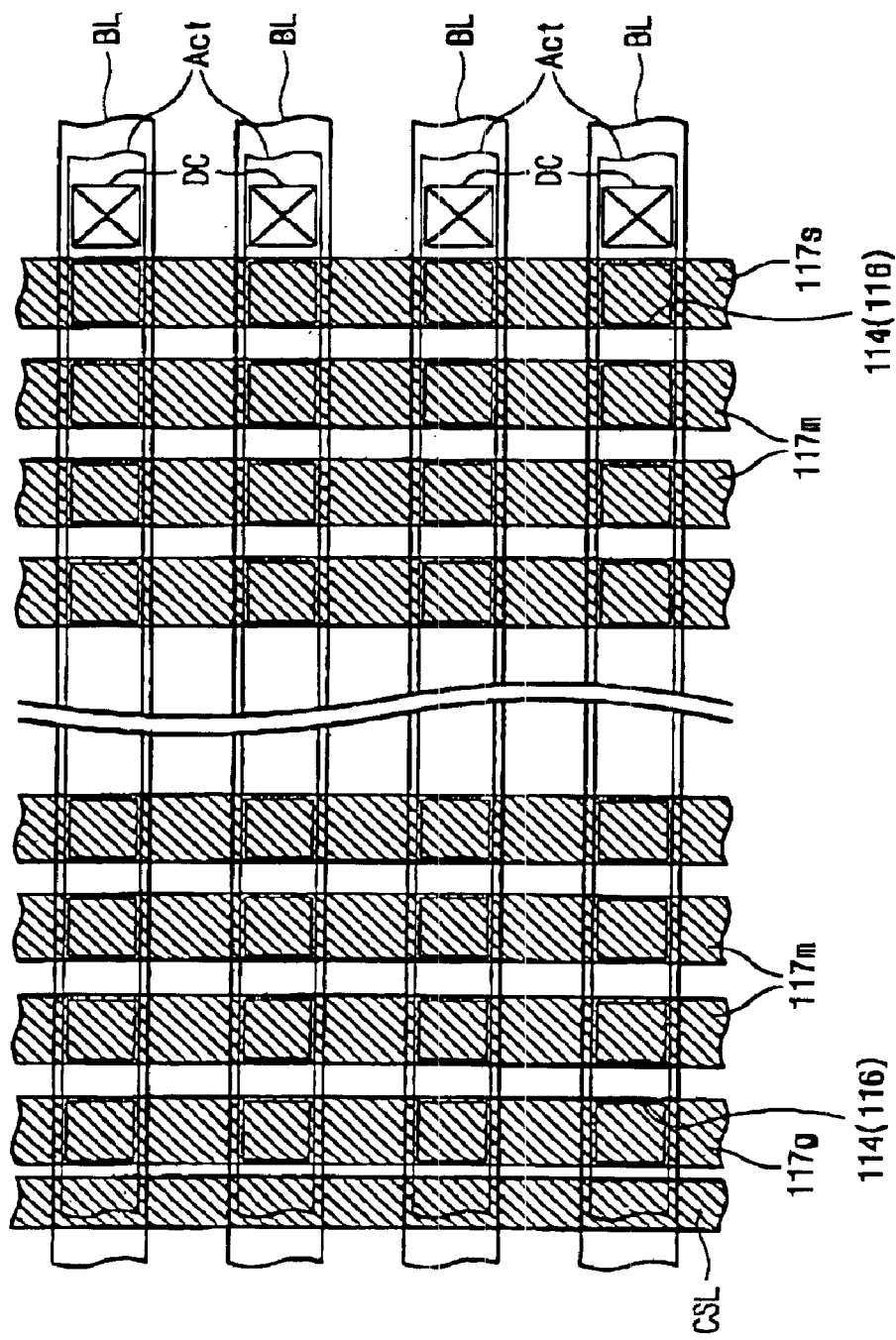
FIG. 8 is a plan view of a memory device according to some embodiments of the present invention.
Figure 9:
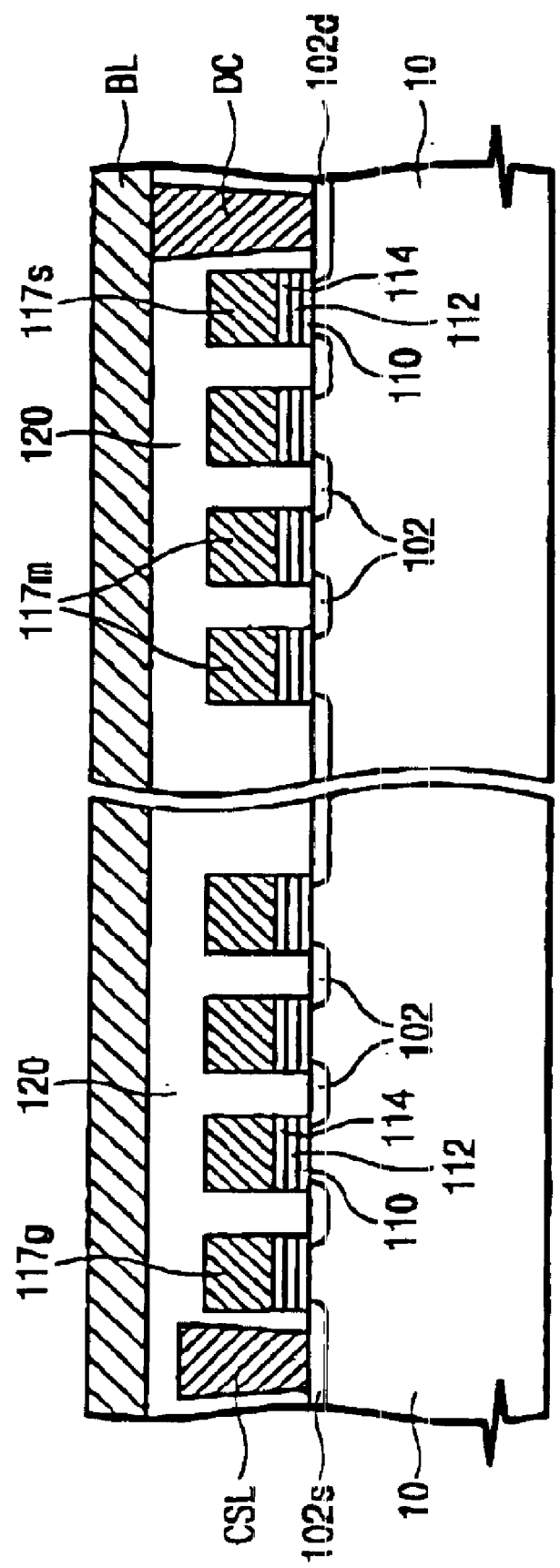
FIG. 9 is a cross-sectional view along a bit line of a memory device, such as the memory device of FIG. 8, according to some embodiments of the present invention.
Figure 10:
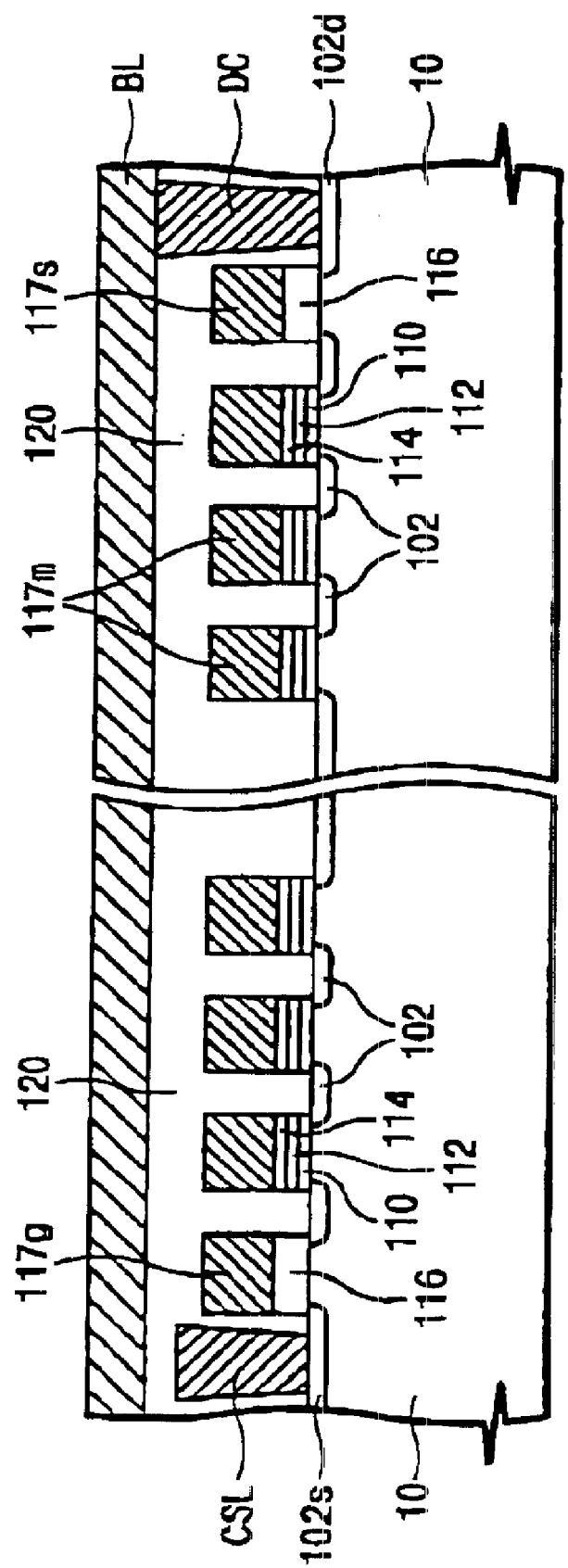
FIG. 10 is a cross-sectional view along a bit line of a memory device, such as the memory device of FIG. 8, according to additional embodiments of the present invention.

Referring to FIGS. 8–10, memory devices according to additional embodiments of the invention are shown. A plurality of active regions ACT are disposed on a semiconductor substrate 10. The active regions ACTs are parallel with one another along one direction of the substrate 10. A common source line CSL crosses over the active regions ACT. Bitline plugs DC are connected to the respective active regions ACT and separated from the common source line CSL by a predetermined distance. The bitline plugs DCs are parallel to the common source line CSL.

A string selection gate electrode 117s and a ground selection gate electrode 117g are parallel with each other, and cross over the active regions ACTs between the common source line CSL and the bitline plugs DCs. The string selection gate electrode 117s is adjacent to the bitline plugs DCs, and the ground selection gate electrode 117g is adjacent to the common source line CSL.

Between the string selection gate electrode 117s and the ground selection gate electrode 117g, a plurality of memory gate electrodes 117m cross over the active regions ACTs. The memory gate electrodes 117m are parallel with one another. A tunneling insulating layer 110, a charge storage layer 112, and a blocking insulating layer 114 are sequentially stacked between the active regions ACTs and the memory gate electrodes 117m. The tunneling insulating layer 110, the charge storage layer 112, and the blocking insulating layer 114 can comprise the same materials as previously described.

An impurity-doped region 102 is on opposite sides of the string selection gate electrode 117s, the ground selection gate electrode 117g, and the memory gate electrodes 117m. The common source line CSL is connected to the respective impurity-doped region (source region) 102s that is adjacent to the ground selection electrode 117g. An interlayer insulating film 120 covers the surface of a semiconductor substrate including the gate electrodes 117g, 117m, and 117s and the common source line CSL. The bitline plugs DCs are connected to impurity-doped regions (drain regions) 102d adjacent to the string selection gate 117s. A plurality of bitlines BLs are formed on the interlayer insulating film 120 to cross over the gate electrodes 117g, 117m, and 117s. The bitlines BLs are electrically connected to the bitline plug DC.

Memory cells may be provided at intersections of the respective memory gate electrodes 117m and the active regions ACTs. Selection transistors may be provided at intersections of the respective selection gates 117s and 117g and the respective active regions ACTs.

As shown in FIG. 9, the memory device may include a tunnel insulating layer 110, a charge storage layer 112, and a blocking insulating layer 114 sequentially stacked to be between the ground selection gate electrode 117g and the string selection gate electrode 117s and the active regions (ACTs of FIG. 8). A negative voltage may be applied to the ground selection gate electrode 117g and the string selection gate electrode 117s to lower the threshold voltage of the selection transistor during memory operations.

According to further embodiments, as shown in FIG. 10, the memory device can include a gate insulating layer 116 between each of the ground selection gate electrode 117g and the string selection gate electrode 117s and the active regions (ACTs of FIG. 8). The gate insulating layer 116 can comprise silicon oxide, silicon oxynitride, or a combination thereof.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A floating trap non-volatile memory device comprising:
   a semiconductor substrate;
   a tunneling insulating layer having a first dielectric constant on the substrate;
   a charge storage layer on the tunneling insulating layer;
   a blocking insulating layer on the charge storage layer, the blocking insulating layer having a second dielectric constant which is greater than the first dielectric constant of the tunneling insulting layer; and
   a gate electrode on the blocking insulating layer.

2. The memory device of claim 1, further comprising a pair of impurity-doped layers in the substrate adjacent to opposite sides of the gate electrode.

3. The memory device of claim 1, wherein the tunneling insulating layer includes silicon oxide.

4. The memory device of claim 1, wherein the blocking insulating layer includes at least one of a metallic oxide material and a metallic oxynitride material of a group III element or group VB element.

5. The memory device of claim 1, wherein the blocking insulating layer is a metal oxide material doped with a group IV element.

6. The memory device of claim 5, wherein the group IV element is one of Zr, Si, Ti, and Hf.

7. The memory device of claim 1, wherein the blocking insulating layer is one of $HfO_2$, $Hf_{1-x}Al_xO_y$, $Al_2O_3$, $La_2O_3$, $Hf_xSi_{1-x}O_2$, Hf—Si-oxynitride, $ZrO_2$, $Zr_xSi_{1-x}O_2$, Zr—Si-oxynitride, and combinations thereof.

8. The memory device of claim 1, wherein the blocking insulating layer is one of $Ta_2O_5$, $TiO_2$, PZT[Pb (Zi,Ti)$O_3$], $PbTiO_3$, $PbZrO_3$, La-doped PZT[(Pb,La)(Zi,Ti)$O_3$], PbO, $SrTiO_3$, $BaTiO_3$, BST[(Ba,Sr)$TiO_3$], SBT (SrBi$_2$Ta$_2$O$_9$), and $Bi_4Ti_3O_{12}$, and combinations thereof.

9. The memory device of claim 1, wherein the blocking insulating layer comprises a first blocking layer of a first material and a second blocking layer of a second material, the second material having a different dielectric constant than the first material.

10. The memory device of claim 1, wherein the blocking insulating layer includes:
    a dielectric layer; and
    a silicon oxide layer between the charge storage layer and the dielectric layer.

11. The memory device of claim 1, wherein the blocking insulating layer includes:
    a dielectric layer; and
    a silicon oxide layer between the dielectric layer and the gate electrode.

12. The memory device of claim 1, wherein the blocking insulating layer includes:
    a dielectric layer;
    a second silicon oxide layer between the charge storage layer and the dielectric layer; and
    a first silicon oxide layer between the dielectric layer and the gate electrode.

13. The memory device of claim 1, wherein the charge storage layer is one of $Si_3N_4$, silicon oxynitride, silicon-rich $SiO_2$, and a ferroelectric material.

14. A floating trap non-volatile memory device comprising:
    a semiconductor substrate;
    a plurality of parallel active regions on the semiconductor substrate;
    a plurality of parallel memory gate electrodes that intersect and pass over the active regions;
    a tunneling insulating layer having a first dielectric constant;
    a blocking insulating layer having a second dielectric constant that is greater than the first dielectric constant of the tunneling insulating layer; and
    a charge storage layer, wherein the tunneling insulating layer, the charge storage layer, and the blocking insulating layer are between the intersections of the active regions and the memory gate electrodes.

15. The memory device of claim 14, further comprising a pair of impurity-doped layers in the substrate adjacent to opposite sides of each of the memory gate electrodes.

16. The memory device of claim 14, further comprising:
    a string selection gate electrode;
    a ground selection gate electrode, wherein the memory gate electrodes are between the string selection gate electrode and the ground selection gate electrode.

17. The memory device of claim 14, further comprising a gate insulating layer between the string selection gate electrode and the active regions, and between the ground selection gate electrode and the active regions.

18. The memory device of claim 14, further comprising a tunneling insulating layer, a charge storage layer, and a blocking insulating layer sequentially stacked between the string selection gate electrode and the respective active regions and between the ground selection gate electrode and the respective active regions.

19. The memory device of claim 14, wherein the tunneling insulating layer includes a silicon thermal oxide material.

20. The memory device of claim 14, wherein the blocking insulating layer includes at least one of a metallic oxide material and a metallic oxynitride material of a group III element or group VB element.

21. The memory device of claim 14, wherein the blocking insulating layer is a metal oxide material doped with a group IV element.

22. The memory device of claim 21, wherein the group IV element is one of Zr, Si, Ti, and Hf.

23. The memory device of claim 14, wherein the blocking insulating layer is one of $HfO_2$, $Hf_{1-x}Al_xO_y$, $Al_2O_3$, $La_2O_3$, $Hf_xSi_{1-x}O_2$, Hf—Si-oxynitride, $ZrO_2$, $Zr_xSi_{1-x}O_2$, Zr—Si-oxynitride, and combinations thereof.

24. The memory device of claim 14, wherein the blocking insulating layer is one of $Ta_2O_5$, $TiO_2$, PZT[Pb (Zi,Ti)$O_3$], $PbTiO_3$, $PbZrO_3$, La-doped PZT[(Pb,La)(Zi,Ti)$O_3$], PbO, $SrTiO_3$, $BaTiO_3$, BST[(Ba,Sr)$TiO_3$], SBT (SrBi2Ta$_2$O$_9$), and $Bi_4Ti_3O_{12}$, and combinations thereof.

25. The memory device of claim 14, wherein the blocking insulating layer includes:
    a dielectric layer; and
    a silicon oxide layer between the charge storage layer and the dielectric layer.

26. The memory device of claim 14, wherein the blocking insulating layer includes:
    a dielectric layer; and
    a silicon oxide layer between the dielectric layer and the memory gate electrodes.

27. The memory device of claim 14, wherein the blocking insulating layer includes:
    a dielectric layer;
    a second silicon oxide layer between the charge storage layer and the dielectric layer; and
    a first silicon oxide layer between the dielectric layer and the memory gate electrodes.

28. The memory device of claim 14, wherein the charge storage layer is one of Si3N4, silicon oxynitride, silicon-rich SiO2, and ferroelectric material.

29. The memory device of claim 1, wherein the blocking insulating layer consists of a dielectric material having a second dielectric constant.

30. A floating trap non-volatile memory device comprising:

a semiconductor substrate;

a tunneling insulating layer having a first dielectric constant on the substrate;

a charge storage layer on the tunneling insulating layer, the charge storage layer having a plurality of trap energy levels;

a blocking insulating layer on the charge storage layer, the blocking insulating layer having a second dielectric constant which is greater than the first dielectric constant of the tunneling insulting layer; and a gate electrode on the blocking insulating layer.

* * * * *

UNITED STATES PATENT AND TRADEMARK OFFICE
CERTIFICATE OF CORRECTION

PATENT NO. : 6,858,906 B2  Page 1 of 1
APPLICATION NO. : 10/184328
DATED : February 22, 2005
INVENTOR(S) : Lee et al.

It is certified that error appears in the above-identified patent and that said Letters Patent is hereby corrected as shown below:

In the Claims:
Column 10, Claim 17, Line 19:
Please correct "The memory device of claim 14"
to read -- The memory device of claim 16 --

Column 10, Claim 18, Line 23:
Please correct "The memory device of claim 14"
to read -- The memory device of claim 16 --

Signed and Sealed this

Twenty-fifth Day of August, 2009

David J. Kappos
*Director of the United States Patent and Trademark Office*